(12) United States Patent
Meng et al.

(10) Patent No.: US 8,889,816 B2
(45) Date of Patent: Nov. 18, 2014

(54) METHOD FOR PREPARING PHOSPHORUS-CONTAINING POLYPHENYLENE OXIDE RESIN WITH LOW MOLECULAR WEIGHT

(75) Inventors: Yundong Meng, Guangdong (CN); Kehong Fang, Guangdong (CN)

(73) Assignee: Shengyi Technology Co., Ltd., Guangdong (CN)

( * ) Notice: Subject to any disclaimer, the term of this patent is extended or adjusted under 35 U.S.C. 154(b) by 0 days.

(21) Appl. No.: 14/236,109

(22) PCT Filed: Dec. 29, 2011

(86) PCT No.: PCT/CN2011/084873
§ 371 (c)(1),
(2), (4) Date: Jan. 30, 2014

(87) PCT Pub. No.: WO2013/097128
PCT Pub. Date: Jul. 4, 2013

(65) Prior Publication Data
US 2014/0148556 A1    May 29, 2014

(51) Int. Cl.
*C08G 79/02*      (2006.01)
*H05K 1/03*       (2006.01)
*C08G 65/48*      (2006.01)
*H05K 1/02*       (2006.01)

(52) U.S. Cl.
CPC ............ *C08G 65/485* (2013.01); *H05K 1/0373* (2013.01); *H05K 1/024* (2013.01); *H05K 2201/012* (2013.01); *C08G 65/48* (2013.01)
USPC ........... 528/167; 525/390; 525/534; 525/538; 528/398; 528/487; 568/660

(58) Field of Classification Search
USPC .......... 525/390, 534, 538; 528/167, 398, 487; 568/660
See application file for complete search history.

(56) References Cited

U.S. PATENT DOCUMENTS

| 4,156,699 A | * | 5/1979 | White | 525/534 |
| 2003/0045757 A1 | * | 3/2003 | Ishii et al. | 568/660 |
| 2013/0075138 A1 | * | 3/2013 | Yu et al. | 174/257 |

FOREIGN PATENT DOCUMENTS

| CN | 1404494 | 3/2003 |
| CN | 101389691 | 3/2009 |
| JP | H09235349 | 9/1997 |
| JP | 3248424 | 1/2002 |
| JP | 2009046631 | 3/2009 |

* cited by examiner

*Primary Examiner* — Robert Jones, Jr.
(74) *Attorney, Agent, or Firm* — McDonald Hopkins LLC

(57) ABSTRACT

Disclosed is a method for preparing a phosphorus-containing polyphenylene oxide resin with a low molecular weight, comprising the steps of: step 1: providing a phosphorus-containing phenolic compound and a raw polyphenylene oxide resin having a number-average molecular weight of more than 10000; step 2: dissolving the raw polyphenylene oxide resin into a solvent to make a solution of the raw polyphenylene oxide resin; step 3: adding the phosphorus-containing phenolic compound into the solution of the raw polyphenylene oxide resin; step 4: introducing an initiator, and carrying out a re-dispersing reaction at a reaction temperature of above 60° C. under the effect of the initiator; and step 5: after the reaction is finished, the product obtained being phosphorus-containing polyphenylene oxide resin with a low molecular weight, the number-average molecular weight thereof being 1000-6000. By dispersing the phosphorus-containing phenolic compound into the solution of polyphenylene oxide resin, and carrying out the re-dispersing reaction in the presence of the initiator to prepare the phosphorus-containing polyphenylene oxide resin with a low molecular weight, the obtained phosphorus-containing polyphenylene oxide resin with a low molecular weight is convenient to process, and suitable for use as the matrix resin of composite materials for high-frequency circuit boards or as an additive component for other polymeric materials.

9 Claims, No Drawings

METHOD FOR PREPARING PHOSPHORUS-CONTAINING POLYPHENYLENE OXIDE RESIN WITH LOW MOLECULAR WEIGHT

TECHNICAL FIELD

The present invention relates to a method for preparing polyphenylene oxide resin, especially a method for preparing phosphorus-containing polyphenylene oxide resin with low molecular weight.

BACKGROUND ART

Currently, the electrical and electronic industry develops rapidly, and electronic products tend to be of lightweight, high performance, high reliability and environmental protection. Electronic circuit boards are also specifically required to be of high heat-resistance, low thermal expansion coefficient, high moisture resistance, environmental protection and flame retardant, low dielectric constant and dielectric loss, and high elastic modulus. Thus the conventional epoxy resin cannot completely meet the developing requirements on electronic circuit boards, and the applications of polyphenylene oxide resin having high heat-resistance, low dielectric constant and dielectric loss and excellent toughness in electronic circuit boards are more and more prominent. Due to high molecular weight, the conventional polyphenylene oxide resin is still deficient in processability.

Due to environmental pollution caused by halogenated flame retardance, phosphorous-containing compounds are generally and industrially applied for achieving the flame retardant effect, e.g. phosphorous-containing phenanthrene type compound DOPO and derivatives thereof. Halogen-free polyphenylene oxide resin compositions currently used in electronic circuit boards usually use the addition-type phosphorous-containing flame retardant to achieve the flame retardant requirements, but there are deficiencies in the moisture resistance and chemical resistance. In addition, since the phosphorous-containing phenolic compound is indissoluble in non-polar solvents, such as toluene, the method of redistributing in the solution reported in JP9-235349 and JP3248424 cannot be used for preparing a phosphorous-containing polyphenylene oxide with low molecular weight.

CONTENTS OF THE INVENTION

The object of the present invention lies in providing a method for preparing phosphorus-containing polyphenylene oxide resin with low molecular weight. The resultant phosphorus-containing polyphenylene oxide resin with low molecular weight is convenient to process, and suitable for use as the matrix resin for high-frequency circuit boards.

In order to achieve said object, the present invention provides a method for preparing phosphorus-containing polyphenylene oxide resin with low molecular weight, comprising the steps of:

step 1: providing a phosphorus-containing phenolic compound and a raw polyphenylene oxide resin having a number-average molecular weight of more than 10000;

step 2: dissolving the raw polyphenylene oxide resin into a solvent to make a solution of the raw polyphenylene oxide resin;

step 3: adding the phosphorus-containing phenolic compound into the solution of the raw polyphenylene oxide resin;

step 4: introducing an initiator, and carrying out a re-dispersing reaction at a reaction temperature of above 60° C. under the effect of the initiator; and step 5: after the reaction is finished, the product obtained being phosphorus-containing polyphenylene oxide resin with a low molecular weight, the number-average molecular weight thereof being 1000-6000.

The raw polyphenylene oxide resin and the phosphorus-containing phenolic compound are in a mass ratio of from 100:80 to 100:4.

The phosphorus-containing phenolic compound is a phosphorus-containing compound comprising one or two or more phenolic hydroxyl groups and is an addition compounds formed by 9,10-dihydro-9-oxa-10-phospha-phenanthrene-10-oxide with quinone, 1,4-naphthaquinone, para-hydroxybenzene maleimide or rosolic acid respectively and selected from the group consisting of other phosphorus-containing phenolic compounds, or combinations thereof.

In step 2, the raw polyphenylene oxide resin and solvent are in a proportion of from 4:100 to 200:100; the solvent is selected from benzene, toluene, xylene, butanone, acetone, n-butanol, iso-butanol and iso-propanol, or combinations thereof.

In step 3, the phosphorus-containing phenolic compound is homogeneously dispersed in the solution of the raw polyphenylene oxide resin.

The initiator is selected from the group consisting of dicumyl peroxide, t-butylcumyl peroxide, di-t-butyl peroxide, isopropyl peroxide t-butyl carbonate, 2,5-dimethyl-2,5-di-t-butylcumylperoxyhexyne-3, 2,5-dimethyl-2,5-di-t-butyl hexane peroxide, p-menthane peroxide, 1,1-bis(t-amylperoxy)cyclohexane, hydrogen peroxide diisopropyl benzene, benzoyl peroxide and benzoyl peroxide derivative, or combinations thereof.

In step 4, the initiator is added in one-time manner or in batches; the reaction materials shall be maintained at the reaction temperature for at least 30 min after the addition of the initiator.

In step 4, a catalyst is further added before or after the addition of the initiator, and is selected from the group consisting of metal salts of naphthenic acid, vanadium pentoxide, aniline, amine compound, quaternary ammonium salts, imidazole and phosphonium salt, or combinations thereof.

In step 5, after the reaction is finished, the product being phosphorus-containing polyphenylene oxide resin with a low molecular weight is washed with water or an alkali solution at room temperature or a temperature higher than 60° C.

The present invention has the following beneficial effects, The present invention involves dispersing the phosphorous-containing phenolic compound in the solution of the raw polyphenylene oxide resin, carrying out the re-dispersing reaction in the presence of the initiator to produce the phosphorus-containing polyphenylene oxide resin with a low molecular weight, wherein the obtained phosphorus-containing polyphenylene oxide resin with a low molecular weight is convenient to process, and suitable for use as the matrix resin of composite materials for high-frequency circuit boards or as an additive component for other polymeric materials

EMBODIMENTS

The phosphorous-containing phenolic compound is indissoluble in non-polar solvents, such as toluene. The phosphorous-containing phenolic compound and the polyphenylene oxide with high molecular weight cannot co-exist in the same phase, so that the phosphorus-containing polyphenylene oxide resin with low molecular weight cannot be obtained by the reaction of the conventional solution system. Upon in-depth research, the inventor finds that the re-dispersing reaction of the polyphenylene oxide can be carried out by homogeneously dispersing the phosphorus-containing phenolic compound into the solution of raw polyphenylene oxide resin and by the initiation of peroxides at a certain temperature. After the reaction, the reaction materials which are originally two phases will become one phase. That is to say, the obtained phosphorus-containing polyphenylene oxide resin has an excellent solubility in non-polar solvents. The obtained phosphorus-containing polyphenylene oxide resin with a low molecular weight is convenient to process, and suitable for use as the matrix resin for high-frequency circuit boards in conjunction with thermosetting resins, such as epoxy resin, cyanate and the like.

Thus the present invention provides a method for preparing phosphorus-containing polyphenylene oxide resin with low molecular weight, comprising the steps of:

Step 1: providing the raw material phosphorus-containing phenolic compound and a raw polyphenylene oxide resin having a number-average molecular weight of more than 10000. Under the conditions of sufficient initiator and reaction, the higher the feeding ratio of the phosphorus-containing phenolic compound is, the lower the number average molecular weight of the product polyphenylene oxide resin. It is generally deemed that the number average molecular weight (Mn) of the polyphenylene oxide resin used in the electrical circuit boards shall be controlled within 1000 to 6000. Thus the raw polyphenylene oxide resin and the phosphorus-containing phenolic compound are preferably in a mass ratio of from 100:80 to 100:4. The phosphorus-containing phenolic compound is a phosphorus-containing compound comprising one or two or more phenolic hydroxyl groups and is an addition compound formed by 9,10-dihydro-9-oxa-10-phosphaphenanthrene-10-oxide with quinone, 1,4-naphthaquinone, para-hydroxybenzene maleimide or rosolic acid respectively (being respectively DOPO-HQ, DOPO-NQ, DOPO-HPM and DOPO-triol) and selected from the group consisting of other phosphorus-containing phenolic compounds, or combinations thereof. The chemical structural formula of DOPO-HQ, DOPO-NQ, DOPO-HPM and DOPO-triol is stated as follows.

Formula I

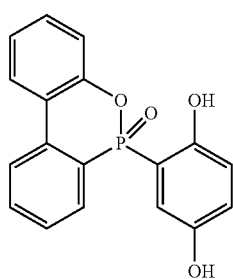

DOPO—HQ

Formula II

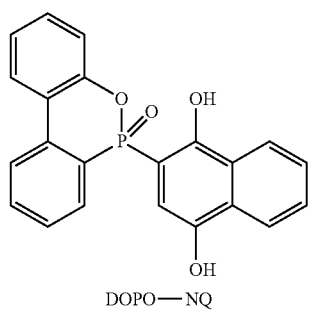

DOPO—NQ

Formula I

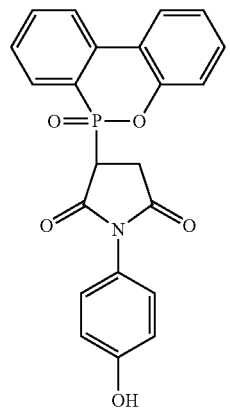

DOPO—HPM

Formula II

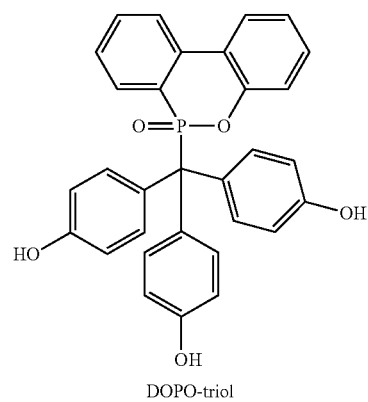

DOPO-triol

Step 2: dissolving the raw polyphenylene oxide resin into a solvent to make a solution of the raw polyphenylene oxide resin. The raw polyphenylene oxide resin and solvent are in a proportion of from 4:100 to 200:100. The raw polyphenylene oxide resin is the commercially available polyphenylene oxide resin having a number average molecular weigh of 10000. The solvent is selected from benzene, toluene, xylene, butanone, acetone, n-butanol, iso-butanol and iso-propanol, or combinations thereof.

Step 3: adding the phosphorus-containing phenolic compound into the solution of the raw polyphenylene oxide resin. In the present invention, the phosphorus-containing phenolic compound needs to be homogeneously dispersed in the solution of the raw polyphenylene oxide resin.

Step 4: introducing an initiator, and carrying out a re-dispersing reaction at a reaction temperature of above 60° C. under the effect of the initiator. The initiator is added in one-time manner or in batches, preferably in batches, more preferably in a rate of less than 0.1 mass part/min.

The initiator is selected from the group consisting of dicumyl peroxide, t-butylcumyl peroxide, di-t-butyl peroxide, isopropyl peroxide t-butyl carbonate, 2,5-dimethyl-2,5-di-t-butylcumylperoxyhexyne-3,2,5-dimethyl-2,5-di-t-butyl hexane peroxide, p-menthane peroxide, 1,1-bis(t-amylperoxy)cyclohexane, hydrogen peroxide diisopropyl benzene, benzoyl peroxide and benzoyl peroxide derivative, or combinations thereof.

The reaction temperature is preferably higher than 80° C. The higher the reaction temperature is, the faster the reaction of the reaction materials is, but the temperature shall be controlled below the boiling point of the solvent. After the addition of the initiator, the reaction materials shall be maintained at the reaction temperature for at least 30 min.

In such step, a catalyst may be further added before or after the addition of the initiator to promote the efficiency of the initiator. The catalyst is selected from the group consisting of metal salts of naphthenic acid, vanadium pentoxide, aniline, amine compound, quaternary ammonium salts, imidazole and phosphonium salt, or combinations thereof. it is not suggested that the catalyst and the initiator be added together after being mixed.

Step 5: after the reaction is finished, the product obtained being phosphorus-containing polyphenylene oxide resin with a low molecular weight, the number-average molecular weight thereof being 1000-6000. In such step, water or alkaline solution is preferably used to wash the product at room temperature or a temperature higher than 60° C. after the reaction.

The present invention is detailedly explained with the examples as follows, but not limited within the scope of the examples.

EXAMPLE 1

Into a reaction vessel with the stirring, temperature-measuring and condensing units was added 100 parts by weight of toluene as the solvent and 50 parts by weight of the raw polyphenylene oxide (Asahi Kasei Chemicals, trade name: S201A), heated to 90° C. and stirred to make the raw polyphenylene oxide completely dissolved. 10 parts by weight of DOPO-HQ (Huizhong Shengshida Technology Co., Ltd., trade name: ODOPB) was homogeneously dispersed in the reaction materials. 8 parts by weight of benzoyl peroxide (Dongguan Kangxin Reagent, trade name: benzoyl peroxide) was added within 40 min, reacted at 90° C. for 120 min. After the temperature reduction, an aqueous sodium bicarbonate solution was used to sufficiently wash, and then the aqueous solution was removed. The product was a fulvous, transparent solution without any suspension. The number average molecular weight (Mn) of the product was measured by the GPC method to be 2670; the molecular weight distribution thereof (Mw/Mn) was 2.3, i.e. obtaining a phosphorus-containing polyphenylene oxide resin with low molecular weight.

EXAMPLE 2

Into a reaction vessel with the stirring, temperature-measuring and condensing units was added 100 parts by weight of toluene as the solvent and 50 parts by weight of the raw polyphenylene oxide (Asahi Kasei Chemicals, trade name: S201A), heated to 90° C. and stirred to make the raw polyphenylene oxide completely dissolved. 10 parts by weight of DOPO-HQ (Huizhong Shengshida Technology Co., Ltd., trade name: ODOPB) was homogeneously dispersed in the reaction materials. 6 parts by weight of benzoyl peroxide (Dongguan Kangxin Reagent, trade name: benzoyl peroxide) was added within 40 min, reacted at 90° C. for 120 min. After the temperature reduction, an aqueous sodium bicarbonate solution was used to sufficiently wash, and then the aqueous solution was removed. The product was a fulvous, transparent solution without any suspension. The number average molecular weight (Mn) of the product was measured by the GPC method to be 3015; the molecular weight distribution thereof (Mw/Mn) was 2,2, i.e. obtaining a phosphorus-containing polyphenylene oxide resin with low molecular weight.

In conclusion, the present invention involves dispersing the phosphorous-containing phenolic compound in the solution of the raw polyphenylene oxide resin, carrying out the re-dispersing reaction in the presence of the initiator to produce the phosphorus-containing polyphenylene oxide resin with a low molecular weight, wherein the obtained phosphorus-containing polyphenylene oxide resin with a low molecular weight is convenient to process, and suitable for use as the matrix resin of composite materials for high-frequency circuit boards or as an additive component for other polymeric materials.

As for those stated above, those ordinarily skilled in the art can make various corresponding changes and deformations according to the technical solutions and concepts of the present invention, but all said changes and deformations shall belong to the protection scope of the present invention.

The invention claimed is:

1. A method for preparing phosphorus-containing polyphenylene oxide resin with low molecular weight, comprising the steps of:
   step 1: providing a phosphorus-containing phenolic compound and a raw polyphenylene oxide resin having a number-average molecular weight of more than 10000;
   step 2: dissolving the raw polyphenylene oxide resin into a solvent to make a solution of the raw polyphenylene oxide resin;
   step 3: adding the phosphorus-containing phenolic compound into the solution of the raw polyphenylene oxide resin;
   step 4: introducing an initiator, and carrying out a re-dispersing reaction at a reaction temperature of above 60° C. under the effect of the initiator; and
   step 5: after the reaction is finished, the product obtained being phosphorus-containing polyphenylene oxide resin with a low molecular weight, the number-average molecular weight thereof being 1000-6000.

2. The method for preparing phosphorus-containing polyphenylene oxide resin with low molecular weight according to claim 1, wherein the raw polyphenylene oxide resin and the phosphorus-containing phenolic compound are in a mass ratio of from 100:80 to 100:4.

3. The method for preparing phosphorus-containing polyphenylene oxide resin with low molecular weight according to claim 1, wherein the phosphorus-containing phenolic compound is a phosphorus-containing compound comprising one or two or more phenolic hydroxyl groups and is an addition corn pound formed by 9,10-dihydro-9-oxa-10-phospha-phenanthrene-10-oxide with quinone, 1,4-naphthaquinone, para-hydroxybenzene maleimide or rosolic acid respectively and selected from the group consisting of other phosphorus-containing phenolic compounds, or combinations thereof.

4. The method for preparing phosphorus-containing polyphenylene oxide resin with low molecular weight according to claim 1, wherein, in step 2, the raw polyphenylene oxide resin and solvent are in a proportion of from 4:100 to 200:100; the solvent is selected from benzene, toluene, xylene, butanone, acetone, n-butanol, iso-butanol and iso-propanol, or combinations thereof.

5. The method for preparing phosphorus-containing polyphenylene oxide resin with low molecular weight according to claim 1, wherein, in step 3, the phosphorus-containing phenolic compound is homogeneously dispersed in the solution of the raw polyphenylene oxide resin.

6. The method for preparing phosphorus-containing polyphenylene oxide resin with low molecular weight according to claim 1, wherein the initiator is selected from the group consisting of dicumyl peroxide, t-butylcumyl peroxide, di-t-butyl peroxide, isopropyl peroxide t-butyl carbonate, 2,5-dimethyl-2,5-di-t-butylcumylperoxyhexyne-3, 2,5-dimethyl-2,5-di-t-butyl hexane peroxide, p-menthane peroxide, 1,1-bis(t-amylperoxy)-cyclohexane, hydrogen peroxide diisopropyl benzene, benzoyl peroxide and benzoyl peroxide derivative, or combinations thereof.

7. The method for preparing phosphorus-containing polyphenylene oxide resin with low molecular weight according to claim 1, wherein, in step 4, the initiator is added in one-time manner or in batches; the reaction materials shall be maintained at the reaction temperature for at least 30 min after the addition of the initiator.

8. The method for preparing phosphorus-containing polyphenylene oxide resin with low molecular weight according to claim 1, wherein, in step 4, a catalyst is further added before or after the addition of the initiator, and is selected from the group consisting of metal salts of naphthenic vanadium pentoxide, aniline, amine compound, quaternary ammonium salts, imidazole and phosphonium salt, or combinations thereof.

9. The method for preparing phosphorus-containing polyphenylene oxide resin with low molecular weight according to claim 1, wherein, in step 5, after the reaction is finished, the product being phosphorus-containing polyphenylene oxide resin with a low molecular weight is washed with water or an alkali solution at room temperature or a temperature higher than 60° C.

* * * * *